US007824826B2

(12) United States Patent
Hsu et al.

(10) Patent No.: US 7,824,826 B2
(45) Date of Patent: Nov. 2, 2010

(54) METHOD AND APPARATUS FOR PERFORMING DARK FIELD DOUBLE DIPOLE LITHOGRAPHY (DDL)

(75) Inventors: Duan-Fu Stephen Hsu, Fremont, CA (US); Sangbong Park, Union City, CA (US); Douglas Van Den Broeke, Sunnyvale, CA (US); Jang Fung Chen, Cupertino, CA (US)

(73) Assignee: ASML MaskTools B.V., Veldhoven (NL)

( * ) Notice: Subject to any disclaimer, the term of this patent is extended or adjusted under 35 U.S.C. 154(b) by 507 days.

(21) Appl. No.: 11/783,261

(22) Filed: Apr. 6, 2007

(65) Prior Publication Data

US 2008/0020296 A1   Jan. 24, 2008

Related U.S. Application Data

(60) Provisional application No. 60/789,560, filed on Apr. 6, 2006.

(51) Int. Cl.
*G03F 1/00* (2006.01)
*G03F 1/14* (2006.01)
*G03F 7/20* (2006.01)
*G06F 17/50* (2006.01)

(52) U.S. Cl. ............................ 430/5; 430/311; 716/19
(58) Field of Classification Search .................. 430/5, 430/311; 716/19–21
See application file for complete search history.

(56) References Cited

U.S. PATENT DOCUMENTS 5,229,872 A   7/1993   Mumola (Continued)

FOREIGN PATENT DOCUMENTS

EP   1 091 252 A2   4/2001

(Continued)

OTHER PUBLICATIONS

Eurlings et al., "0.11 μm imaging in KrF lithography using dipole illumination", Proceedings of SPIE, vol. 4404 (2001) pp. 266-278.

(Continued)

*Primary Examiner*—Mark F Huff
*Assistant Examiner*—John Ruggles
(74) *Attorney, Agent, or Firm*—Pillsbury Winthrop Shaw Pittman LLP

(57) ABSTRACT

A method of generating complementary dark field masks for use in a dark field double dipole imaging process. The method includes the steps of identifying a target pattern having a plurality of features, including horizontal and vertical features; generating a horizontal mask based on the target pattern, where the horizontal mask includes low contrast vertical features. The generation of the horizontal mask includes the steps of optimizing the bias of the low contrast vertical features contained in the horizontal mask; and applying assist features to the horizontal mask. The method further includes generating a vertical mask based on the target pattern, where the vertical mask contains low contrast horizontal features. The generation of the vertical mask includes the steps of optimizing the bias of low contrast horizontal features contained in the vertical mask; and applying assist features to the vertical mask.

This method is enabled by a non-transitory computer readable medium configured to store program instructions for execution by a processor. The complementary dark field masks are used for patterning a layer of radiation-sensitive material in a device manufacturing method.

15 Claims, 18 Drawing Sheets

U.S. PATENT DOCUMENTS

| | | |
|---|---|---|
| 5,296,891 A | 3/1994 | Vogt et al. |
| 5,446,521 A | 8/1995 | Hainsey et al. |
| 5,523,193 A | 6/1996 | Nelson |
| 5,546,225 A | 8/1996 | Shiraishi |
| 5,841,517 A | 11/1998 | Tanibata |
| 5,881,125 A | 3/1999 | Dao |
| 5,969,441 A | 10/1999 | Loopstra et al. |
| 6,046,792 A | 4/2000 | Van der Werf et al. |
| 6,255,024 B1 | 7/2001 | Pierrat |
| 6,268,091 B1 | 7/2001 | Pierrat |
| 6,553,562 B2 | 4/2003 | Capodieci et al. |
| 6,671,035 B2 | 12/2003 | Eurlings et al. |
| 6,745,380 B2 | 6/2004 | Bodendorf et al. |
| 6,792,591 B2 | 9/2004 | Shi et al. |
| 6,807,662 B2 | 10/2004 | Toublan et al. |
| 6,811,954 B1 | 11/2004 | Fukuda |
| 6,851,103 B2 | 2/2005 | Van Den Broeke et al. |
| 6,855,486 B1 | 2/2005 | Finders et al. |
| 6,875,545 B2 | 4/2005 | Eurlings |
| 6,915,505 B2 | 7/2005 | Hsu et al. |
| 7,138,212 B2 | 11/2006 | Hsu et al. ............... 430/5 |
| 7,246,342 B2 | 7/2007 | Hsu et al. |
| 7,666,554 B2 | 2/2010 | Hsu et al. |
| 7,681,171 B2 | 3/2010 | Chen et al. |
| 2002/0166107 A1 | 11/2002 | Capodieci et al. |
| 2003/0082463 A1 | 5/2003 | Laidig et al. |
| 2004/0003368 A1 | 1/2004 | Hsu et al. |
| 2004/0005089 A1 | 1/2004 | Robles et al. |
| 2004/0139418 A1 | 7/2004 | Shi et al. |
| 2005/0102648 A1 | 5/2005 | Hsu et al. |
| 2006/0277521 A1 | 12/2006 | Chen |
| 2008/0020296 A1 | 1/2008 | Hsu et al. |

FOREIGN PATENT DOCUMENTS

| | | |
|---|---|---|
| EP | 1 152 289 A2 | 11/2001 |
| EP | 1 308 780 A2 | 5/2003 |
| EP | 1420294 | 5/2005 |
| JP | 9-288345 | 11/1997 |
| JP | 2001-126983 | 5/2001 |
| JP | 2001-203139 | 7/2001 |
| JP | 2001-222097 | 8/2001 |
| JP | 2001-223155 | 8/2001 |
| WO | WO 98/40791 | 9/1998 |
| WO | WO 01/63653 | 8/2001 |

OTHER PUBLICATIONS

Hsu et al., "65 nm Full-Chip Implementation Using Double Dipole Lithography", Proceedings of SPIE, Bellingham, VA, vol. 5040, No. 1, Feb. 25, 2003, pp. 215-231, XP 009024366.

Hsu et al., "Dipole decomposition mask design for full-chip implementation at 100nm technology node and beyond", Proceedings of The SPIE, Bellingham, VA, vol. 4691, Mar. 5, 2002, pp. 476-490, XP 002261072.

Torres et al., "Model-assisted double dipole decomposition", Proceedings of The SPIE, Bellingham, VA, vol. 4691, Mar. 5, 2002, pp. 407-417, XP 002257323.

Torres, J.A., et al. Proceedings of the SPIE, (2002) ISSN: 0277-786X.

Nam, "Patterning 220nm Pitch DRAM Patterns by Using Double Mask Exposure", Proceedings of SPIE, vol. 4000, (Mar. 2000), pp. 283-292.

Finders et al., "Can DUV take us below 100 nm?" Proceedings of SPIE, vol. 4346, (2000), pp. 153-165.

Kim et al., "Feasibility Study of Printing Sub 100 nm with ArF Lithography", Proceedings of SPIE, vol. 4346, (2000), pp. 214-221.

"Mask Topography Effects in Projection Printing of Phase-Shifting Masks", Alfred K. Wong and Andrew R. Neureuther, Fellow, IEEE Transactions on Electron Devices, vol. 41, No. 6, Jun. 1994.

"Spatial Frequency Doubling Lithography (SFDL) of Periodic Structures for Integrated Optical Circuit Technology", Tanya E. Jewell and Donald L. White. Journal of Lightwave Technology, vol. 7, No. 9, Sep. 1989.

| CD 70nm | Annular | Cquad | Dipole X |
|---|---|---|---|
| NILS | 1.31 | 1.02 | 2.03 |
| Imin | 0.223 | 0.253 | 0.145 |
| Line Thd | 0.36 | 0.36 | 0.35 |

| CD 70nm | Annular | Cquad | Dipole X |
|---|---|---|---|
| NILS | 1.2 | 1.03 | 1.56 |
| Imax | 0.35 | 0.305 | 0.45 |
| Space Thd | 0.26 | 0.23 | 0.31 |

| 70nm | L 1:1 | S 1:1 | L 1:2 | S 1:2 | L 1:3 | S 1:3 |
|---|---|---|---|---|---|---|
| NILS | 2.08 | 2.08 | 2.03 | 1.56 | 1.63 | 1.12 |
| $I_{max\ or\ min}$ | 0.118 | 0.577 | 0.145 | 0.450 | 0.198 | 0.339 |
| thres | 0.35 | 0.35 | 0.35 | 0.31 | 0.36 | 0.26 |

METHOD AND APPARATUS FOR PERFORMING DARK FIELD DOUBLE DIPOLE LITHOGRAPHY (DDL)

CLAIM OF PRIORITY

This patent application, and any patent(s) issuing therefrom, claims priority to U.S. provisional patent application No. 60/789,560, filed on Apr. 6, 2006, entitled "Method For Performing Dark Field Double Dipole Lithography (DDL)", which is incorporated herein by reference in its entirety.

FIELD OF THE INVENTION

The present invention provides a novel process for forming masks for use in double dipole lithography, and more specifically, a method for forming masks for use in dark field double dipole lithography process. In addition, the present invention relates to a device manufacturing method using a lithographic apparatus comprising a radiation system for providing a projection beam of radiation; a mask table for holding a reticle, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, and incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, as the demand continues for even higher performance of semiconductor devices, the design rule shrink rate is outpacing the progress of both of the exposure wavelength reduction and the advancement of high Numerical Aperture (NA) lenses. This factor has presented a challenge to lithographers to push optical lithography beyond the limit that was thought possible a few years ago. As is known, Resolution Enhancement Techniques (RETs) have become indispensable in low $k_1$ optical lithography. Strong Off-Axis Illumination (OAI), which uses 2-beam imaging with symmetrical $0^{th}$ and $1^{st}$ orders in the lens pupil, can greatly enhance resolution and contrast. Dipole illumination is the most extreme case of OAI, and is capable of providing better imaging contrast with improved process latitude for very low $k_1$ imaging.

Current techniques utilizing dipole illumination typically encompass the use of a multiple exposure process in which a first exposure is utilized to image features oriented in a first direction (i.e., horizontally oriented features) and a second exposure is utilized to image features oriented in a second direction (i.e., vertically oriented features). This is accomplished by converting the target pattern into, for example, two masks having horizontal and vertical orientations, respectively. Once the target pattern is converted in this manner, a y-dipole exposure is utilized to image the horizontally oriented features, and a x-dipole exposure is utilized to image the vertically oriented features.

As known dipole imaging techniques utilize a clear field mask, one important aspect of double dipole illumination is that when imaging the horizontally oriented features, the vertically oriented features must be protected (i.e., shielded) so the vertically oriented features are not degraded. The opposite is true when vertically oriented features are imaged (i.e., the horizontally oriented features must be protected). This shielding requirement can lead to mask making complications as well as limit the overall performance of the imaging process (see, e.g., U.S. Pat. No. 7,138,212)

Accordingly, there exists a need for a method which allows for performing double dipole lithography utilizing a dark field mask so as to eliminate the complications that result from the shielding requirements necessary when utilizing clear field masks in a double dipole lithography process.

SUMMARY OF THE INVENTION

In an effort to solve the foregoing needs, it is one object of the present invention to provide a method for performing dark field double dipole lithography. As noted above, by utilizing a dark field in the imaging process, it is possible to eliminate the issues associated with shielding previously imaged features when utilizing a clear field imaging process.

More specifically, the present invention relates to a method of generating complementary masks for use in a dark field double dipole imaging process. The method includes the steps of identifying a target pattern having a plurality of features, including horizontal and vertical features; generating a horizontal mask based on the target pattern, where the horizontal mask includes low contrast vertical features. The generation of the horizontal mask includes the steps of optimizing the bias of the low contrast vertical features contained in the horizontal mask; and applying assist features to the horizontal mask. The method further includes generating a vertical mask based on the target pattern, where the vertical mask contains low contrast horizontal features. The generation of the vertical mask includes the steps of optimizing the bias of low contrast horizontal features contained in the vertical mask; and applying assist features to the vertical mask.

The present invention also relates to a computer readable medium configured to store program instructions for execution by a processor. The program instructions enable the processor to generate files corresponding to complementary masks for use in a dark field double dipole imaging process. The generation of the files includes the steps of identifying a target pattern having a plurality of features, including horizontal and vertical features; generating a horizontal mask based on the target pattern, where the horizontal mask includes low contrast vertical features. The generation of the horizontal mask includes the steps of optimizing the bias of the low contrast vertical features contained in the horizontal mask; and applying assist features to the horizontal mask. The generation of the files further includes generating a vertical mask based on the target pattern, where the vertical mask contains low contrast horizontal features. The generation of the vertical mask includes the steps of optimizing the bias of low contrast horizontal features contained in the vertical mask; and applying assist features to the vertical mask.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. Most importantly, by utilizing a dark field mask in the double dipole imaging process, it is possible to eliminate the issues associated with shielding previously imaged features when utilizing a clear field imaging process.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

DETAILED DESCRIPTION OF THE INVENTION

As explained in more detail below, the preferred embodiment of the present invention provides a method and apparatus for performing dark field double dipole lithography "DDL". Specifically, the present invention provides a method for decomposing a target pattern into a first mask to be imaged utilizing a first dipole illumination (i.e., x-dipole) and a second mask to be imaged utilizing a second dipole illumination (i.e., y-dipole), where the masks utilize dark field imaging. Prior to discussing the present invention, a brief discussion of clear field and dark field imaging is provided.

Clear field DDL, which can be utilized with immersion and polarization (as can dark field), is a good resolution enhancement technique "RET" solution for various imaging tasks, such as imaging a poly-gate layer. Advantages associated with the clear field DDL techniques are, for example, that it resolves the scalability and printability problem for scattering bars (SB) or assist features (AF); allows printing devices using high contrast dipole illumination; and enables application of linear polarization for patterning device structures based on model based layout conversion methods.

Figure 1A:
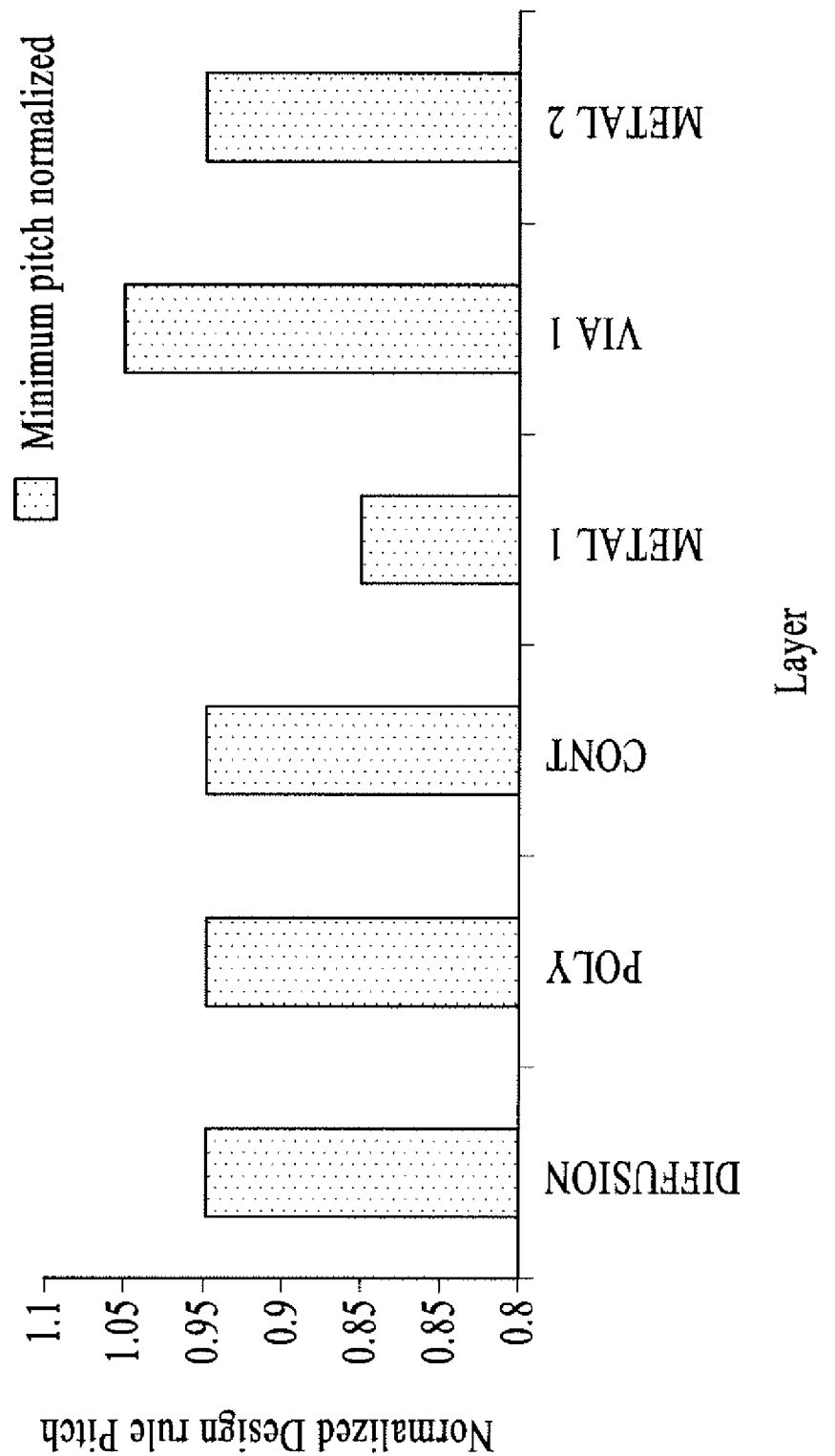
FIG. 1a illustrates normalized design rule requirements for the various components found in a typical IC design.
Figure 1B:
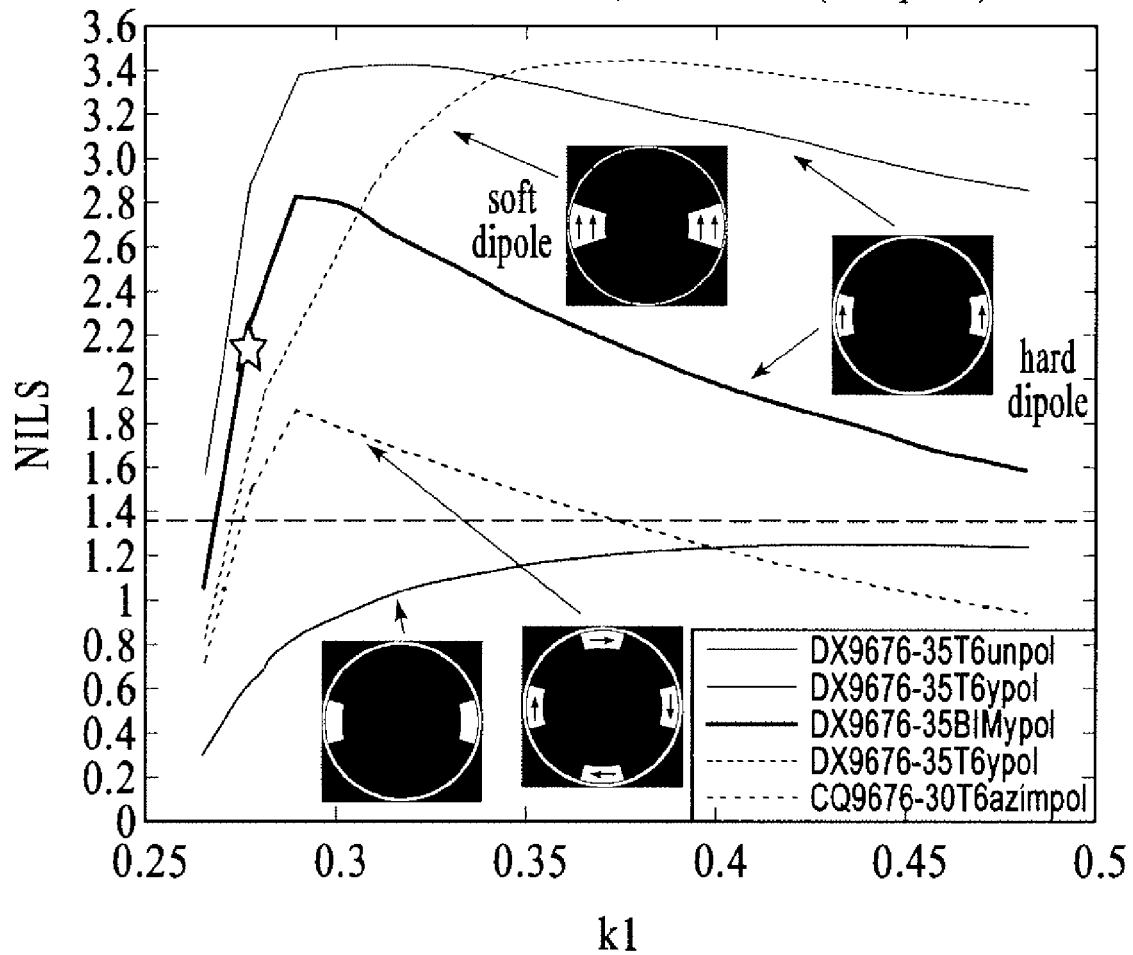
FIG. 1b illustrates the resulting NILS for various illumination conditions for a 45 nm half pitch where mask CD varies from 45 nm to 100 nm under different $k_1$ conditions.

Referring to FIG. 1a, the metal 1 pitch of an IC design is often utilized as one of the fundamental measures for successive device generations because the metal 1 pitch of a given design typically defines the density of integration and is therefore the dimension that is driven the hardest from a pitch shrinking perspective. Presently, the back end metal interconnects processing typically utilizes a low-k dielectric with copper damascene integration scheme that requires printing small dimension trenches at very tight pitches. Due to the inherent high contrast associated with dipole illumination, it is a good illumination choice for imaging such dense trenches. FIG. 1b shows the simulated normalized image log slope (NILS=CD*ILS) "NILS" for 45 nm half pitch where mask CD varies from 45 to 100 nm versus different $k_1$, where $k_1$=0.5 pitch*NA/$\lambda$, where NA corresponds to the numerical aperture and $\lambda$ corresponds to the exposure wavelength of the illumination device. The general trend of FIG. 1b shows that the lower the $k_1$, the worse the resulting NILS. For the 45 nm node, features CD on wafer are closer to a quarter of the exposure wavelength, which makes dark field imaging challenging. As such, dipole illumination is a good candidate to improve the NILS (higher NILS corresponds to higher contrast and therefore better imaging). It is noted that in FIG. 1b, for the 45 nm node even with the most aggressive "hard" dipole setting with very small sigma delta between sigma in and sigma out, the NILS is still too low to achieve a robust imaging. Only when dipole imaging is combined with linear polarization is there sufficient contrast for imaging at $k_1$ near 0.3.

Figure 2A:
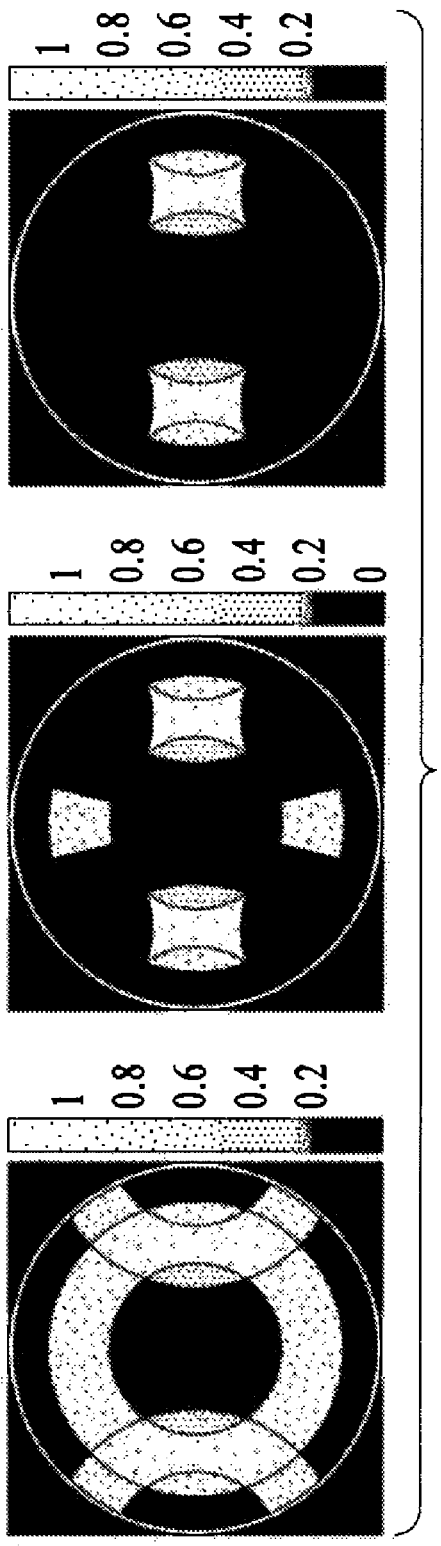
FIGS. 2a-2f compare the impact of illumination on clear field and dark field imaging.
Figure 2B:
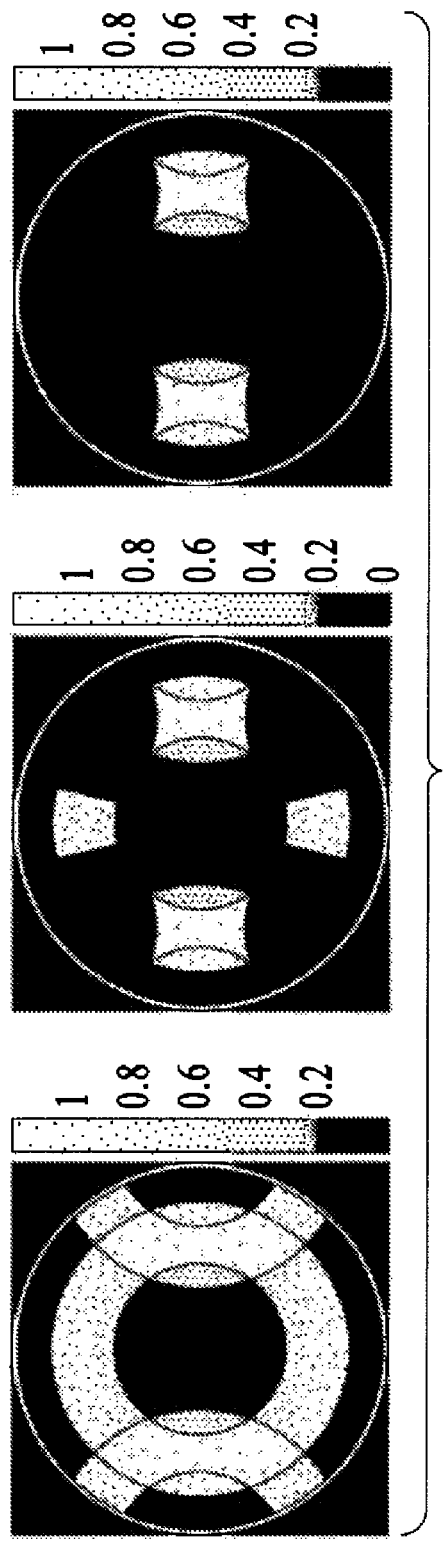
Figure 2D:
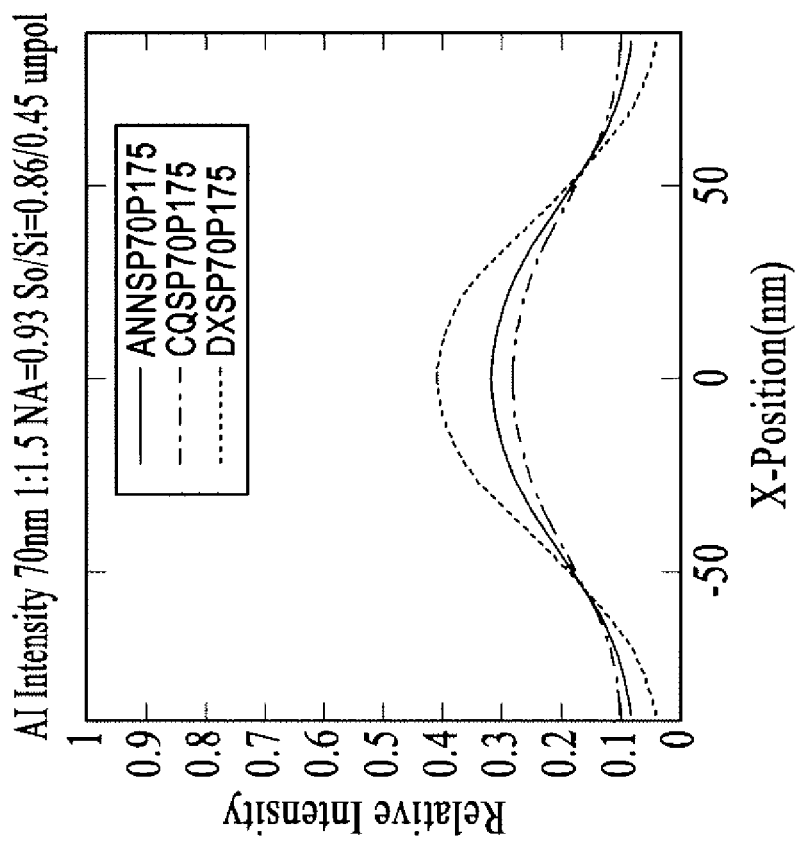
Figure 2C:
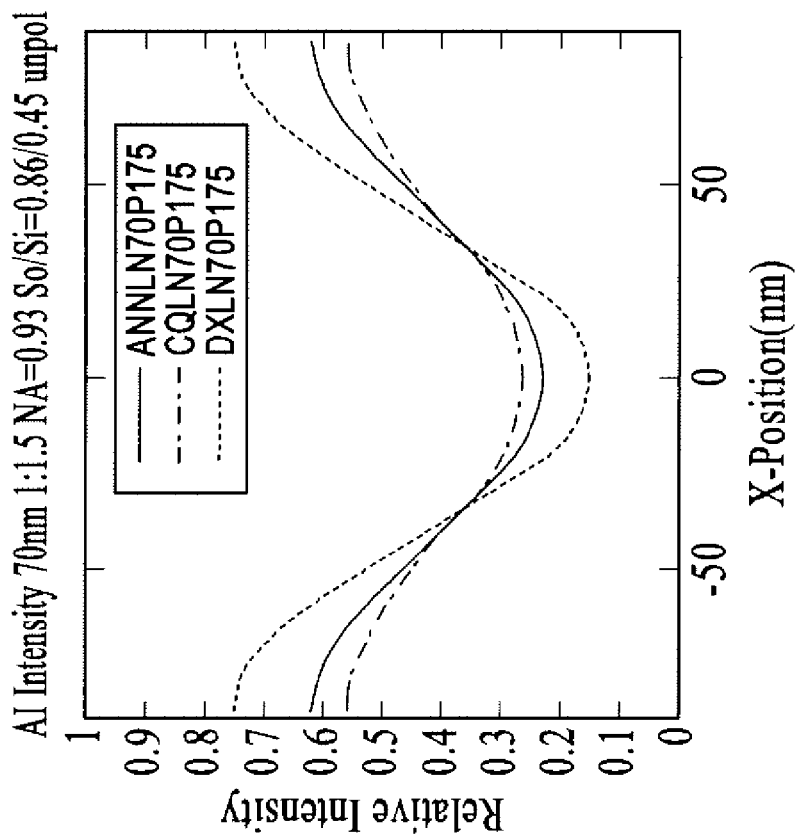
Figures 2E, 2F, 3:
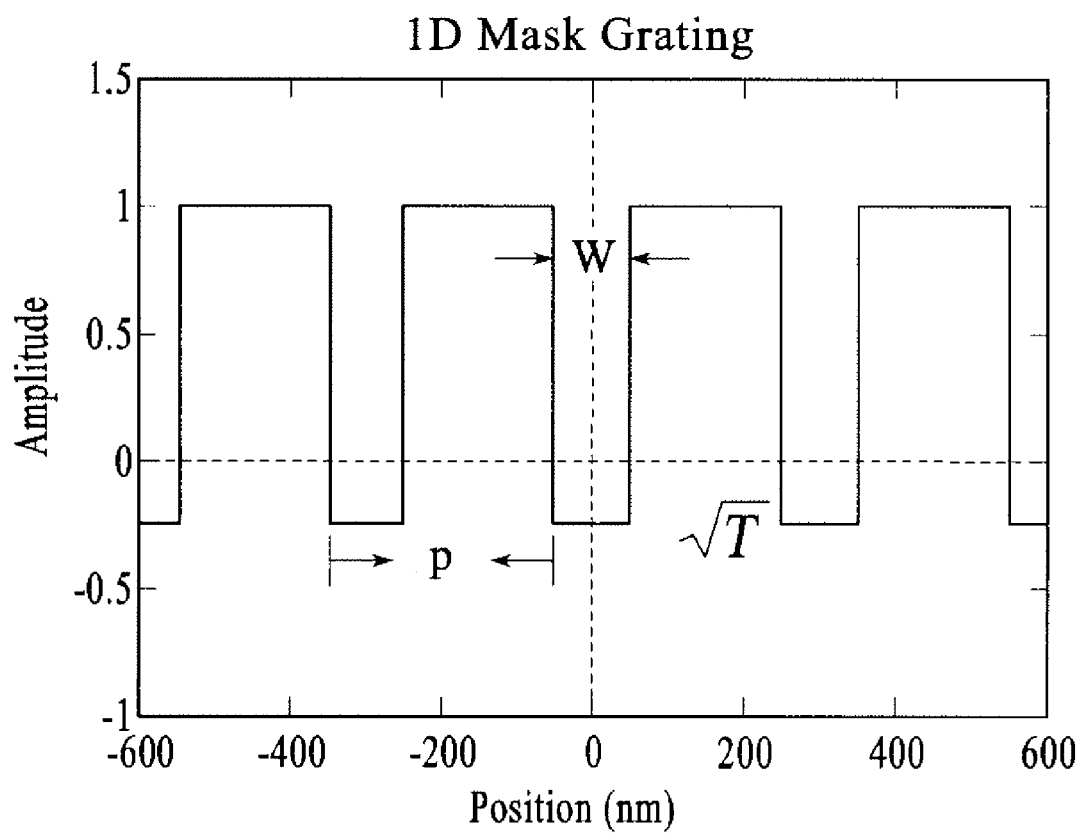
FIG. 3 illustrates an exemplary 1-dimensional mask grating.

Referring to FIGS. 2a-2f, in order to compare the impact of illumination on clear field and dark field imaging, three illumination modes were selected for comparison: (1) annular, (2) c-quad (cross-quad) and (3) dipole x, all with 0.93 NA immersion. The mask utilized to conduct the comparison was a binary intensity mask "BIM" with 70 nm critical dimension (CD) at 175 nm pitch. FIGS. 2a and 2b show the diffraction pattern in the lens pupil for clear field (70 nm chrome line, 105 nm space) and dark field (70 nm clear, 105 nm chrome), respectively. The resulting first order diffraction pattern is different, and the $0^{th}$ diffraction order amplitude is different for all three illuminations. FIG. 2c is the resulting aerial image intensity of the clear field mask for each of the illuminations, and FIG. 2d is the resulting aerial image intensity of the dark field mask for each of the illuminations. FIG. 2e shows the corresponding NILS (normalized image log slope), minimum intensity ($I_{min}$) and the threshold value to print to 70 nm line for each of the illuminations for the clear field mask, while FIG. 2f does the same for the dark field mask.

As is shown, the x-dipole illumination provides the best NILS and best $I_{min}$ in both the clear field and dark field cases. C-quad has the worst contrast and highest 1 mm (in the clear field case, and lowest $I_{min}$ in the dark field case) which is due to the fact that only 25% of the first-order diffracted light is contributing to imaging while for the x-dipole, 50% of the $1^{st}$ order diffracted light is captured for imaging. It is noted that for the clear field case, the imaging threshold for all three illuminations is very close to 0.35 of intensity level, thus the dose required to print to the line CD target should be comparable. For both clear field and dark field cases, dipole gives the best image quality while c-quad is the worst of the three.

In order to understand the fundamental difference between clear field and dark field imaging under dipole illumination, it is first necessary to understand the difference in the respective diffraction patterns. Consider a point on the source and a 1-D grating (see, FIG. 3) of width (w), pitch (p) and intensity transmission (T). This mask can be expressed as:

$$m(x) = \left(1 + \sqrt{T}\right) rect\left(\frac{x}{w}\right) \otimes comb\left(\frac{x}{p}\right) - \sqrt{T}$$

For 1D grating take Fourier transform of the mask $$F\{m(x)\} =$$

$$\left(1 + \sqrt{T}\right) * \sum_{-\infty}^{\infty} \delta\left(f_x - \frac{n}{p}\right) * \left[\frac{w}{p} \text{Sinc}\left(n\frac{w}{p}\right)\right] - \sqrt{T}\,\delta(f_x),$$

where $\delta$ is the delta function $p \sin(\theta) = n\lambda$, $f_x = \sin(\theta)$ 0th order, $n = 0$, $f_x = 0 \Rightarrow F_0(f_x) = \left(1 + \sqrt{T}\right)\frac{w}{p} - \sqrt{T} \pm 1$ orders, $n = 1, f_x = \frac{1}{p} \Rightarrow F_1(f_x) = \frac{1}{\pi}\left(1 + \sqrt{T}\right)\left[\sin\left(\frac{\pi w}{p}\right)\right] - \sqrt{T}$ for BIM Dark 0th order = $\frac{w}{p}$       Equation 1

1st orders = $\frac{1}{\pi}\sin\left(\frac{\pi w}{p}\right)$       Equation 2

From Equation 1, it is clear that for a dark field mask with a fixed trench CD, the larger the pitch, the smaller the $0^{th}$ diffraction order. Babinet's principle states that the diffraction pattern of two complementary masks have the same diffraction pattern except the $0^{th}$ order. Babinet's principle can be written as:

$$A_{clear}(f_x) + A_{dark}(f_x) = \delta(f_x),\quad \text{Equation 3}$$

where A is the scalar amplitude, $f_x=0$, $\delta(f_x)=1$

From Equation 3, the only difference between the clear field mask and the dark field mask is amplitude of the $0^{th}$ diffraction order. The $1^{st}$ diffractive order has the same amplitude with the opposite sign.

for BIM Clear

0th order = $1 - \frac{w}{p}$       Equation 4

1st orders = $-\frac{1}{\pi}\sin\left(\frac{\pi w}{p}\right)$       Equation 5

Figure 4A:
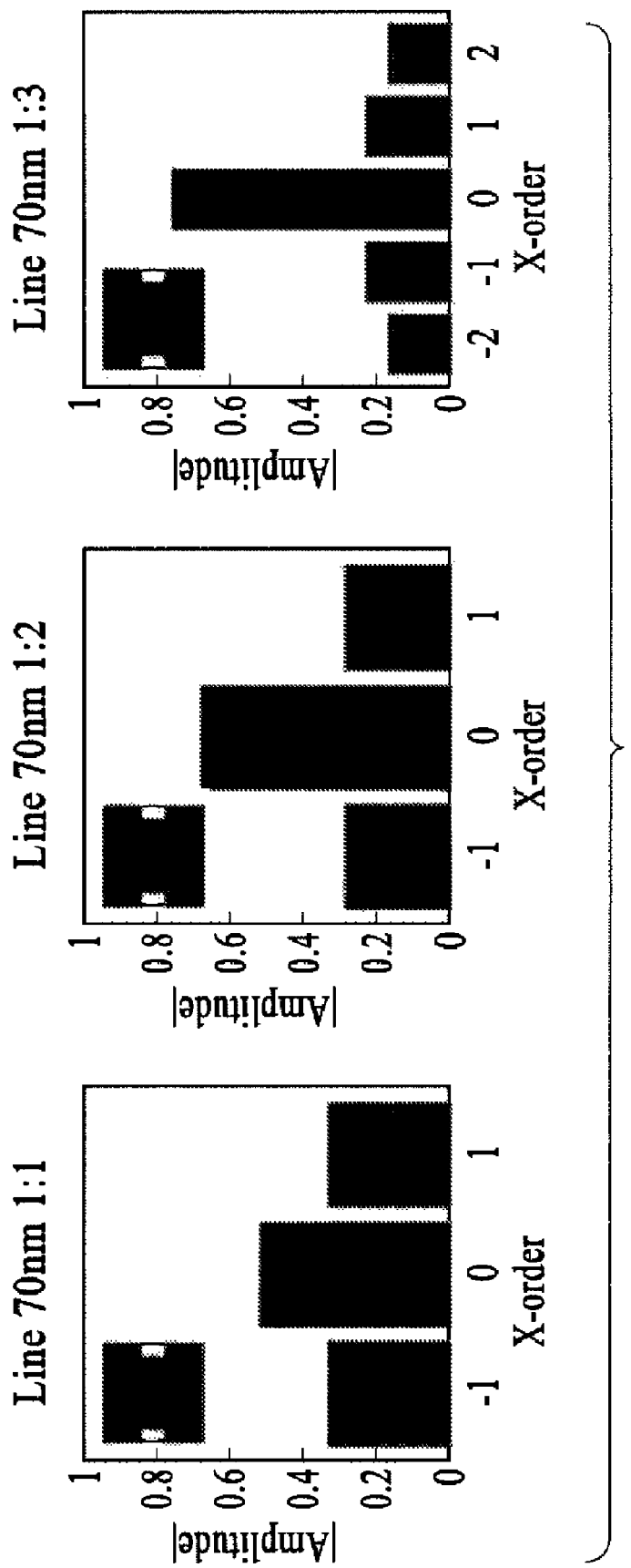
FIGS. 4a and 4b illustrate exemplary the diffraction patterns associated with a 70 nm line (i.e., clear field) and a 70 nm space (dark field).
Figure 4B:
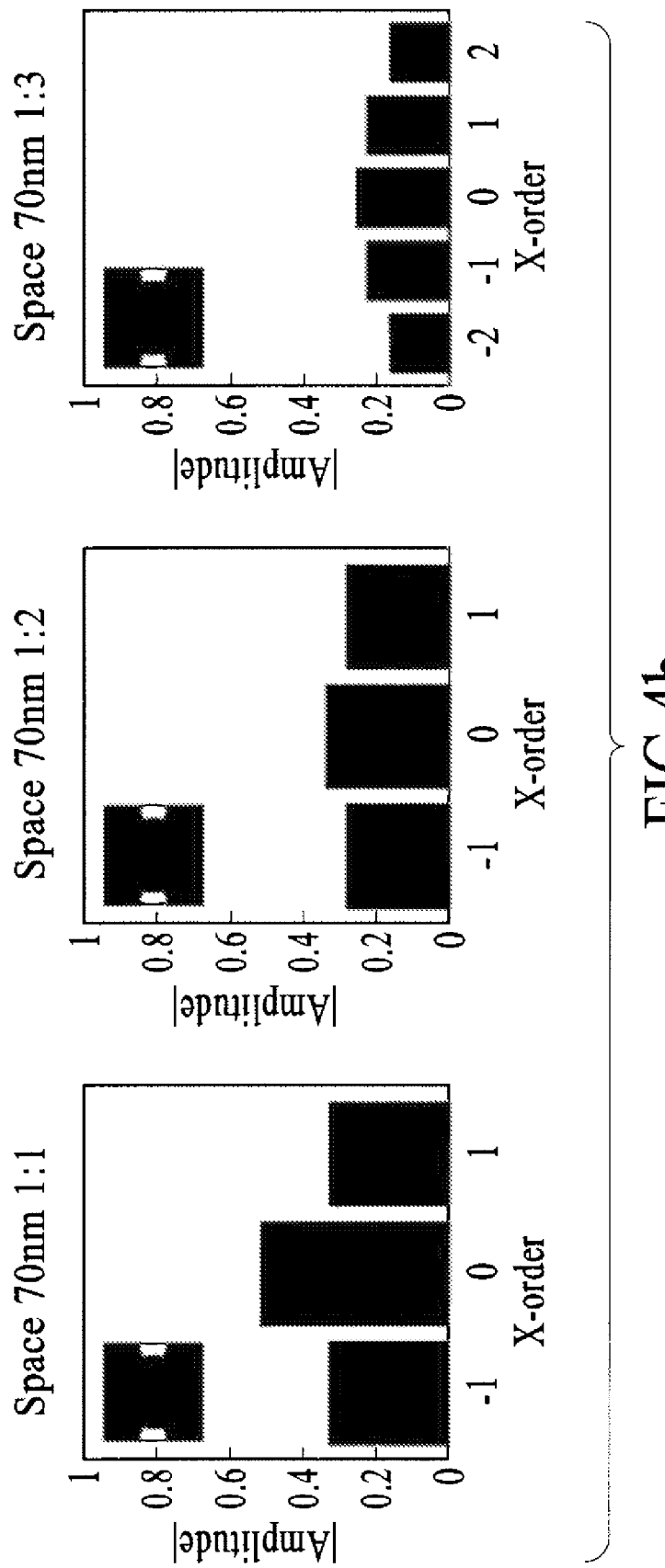

From Equation 4, it is evident that for a clear field mask, the larger the pitch, the lower the $0^{th}$ diffraction order. The above discussions only consider one point from the source, but it is useful to understand the example in FIGS. 4a and 4b which illustrates the diffraction patterns for a 70 nm line (i.e., clear field) and a 70 nm space (dark field) at 1:1, 1:1.5, and 1:2 ratios, respectively. For 1:1 ratio (i.e., feature width-to-pitch), both clear and dark field cases are the same. From 1:1.5 to 1:2 ratios upward, there is a significant difference in the $0^{th}$ diffraction order amplitude. For example, with the 1:2 ratio; the $0^{th}$ diffraction order amplitude for the clear field mask is 0.67, while for the dark field mask the $0^{th}$ diffraction order amplitude is 0.33. For the first and second diffraction orders, the magnitude of the diffraction order amplitude is the same for clear field and dark field mask with opposite signs.

Figure 4D:
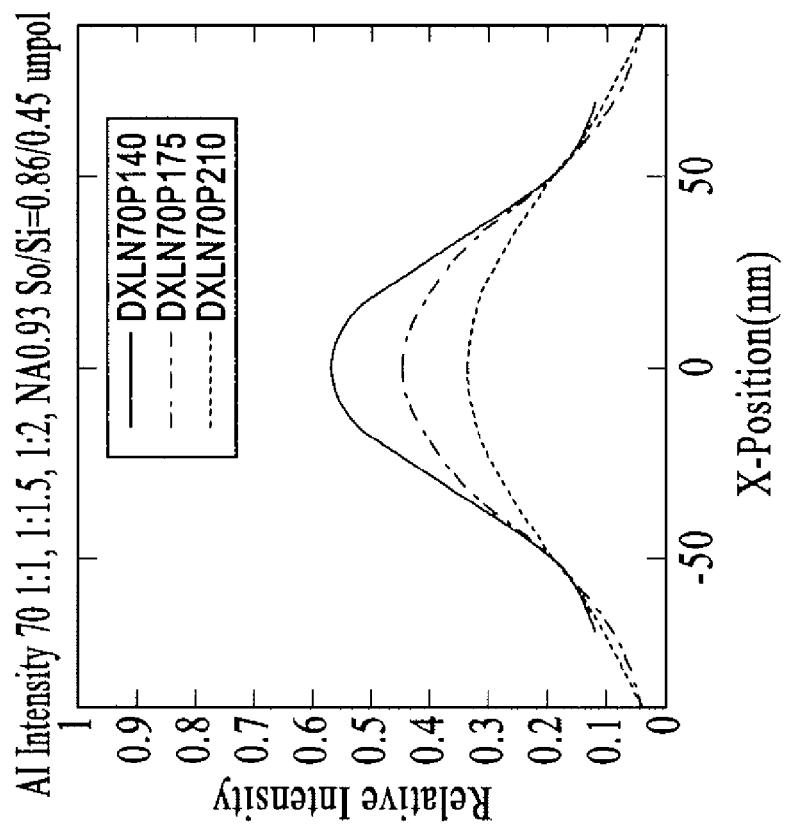
FIG. 4c and FIG. 4d illustrate the corresponding aerial images for clear field mask and dark field mask associated with the 70 nm line (i.e., clear field) and the 70 nm space at a duty ratio of 1:1, 1:2 and 1:3 (dark field) of FIGS. 4a and 4b, respectively.
Figure 4C:
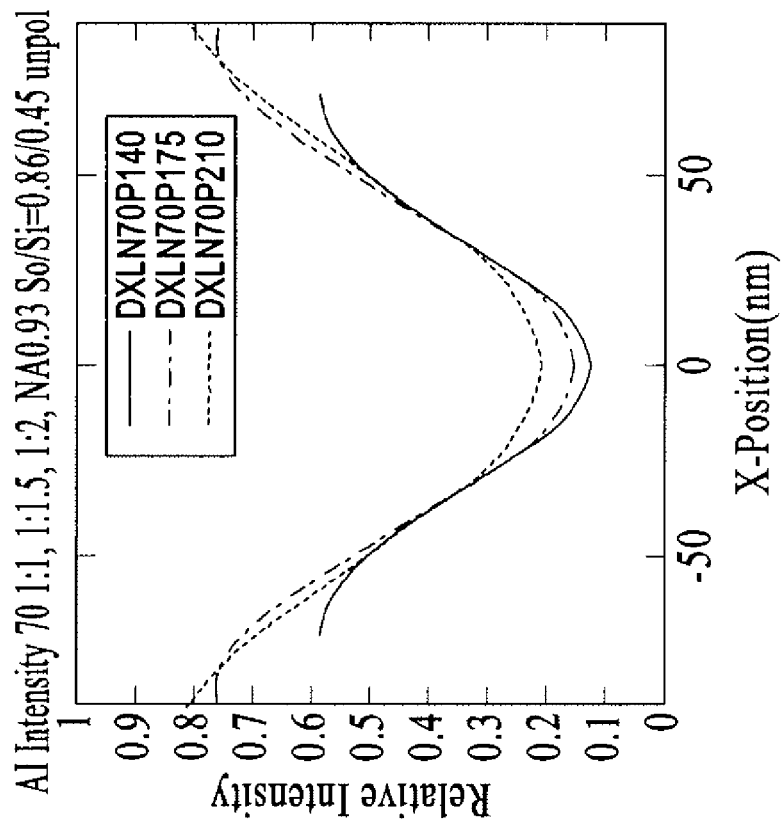
Figures 4E, 5:
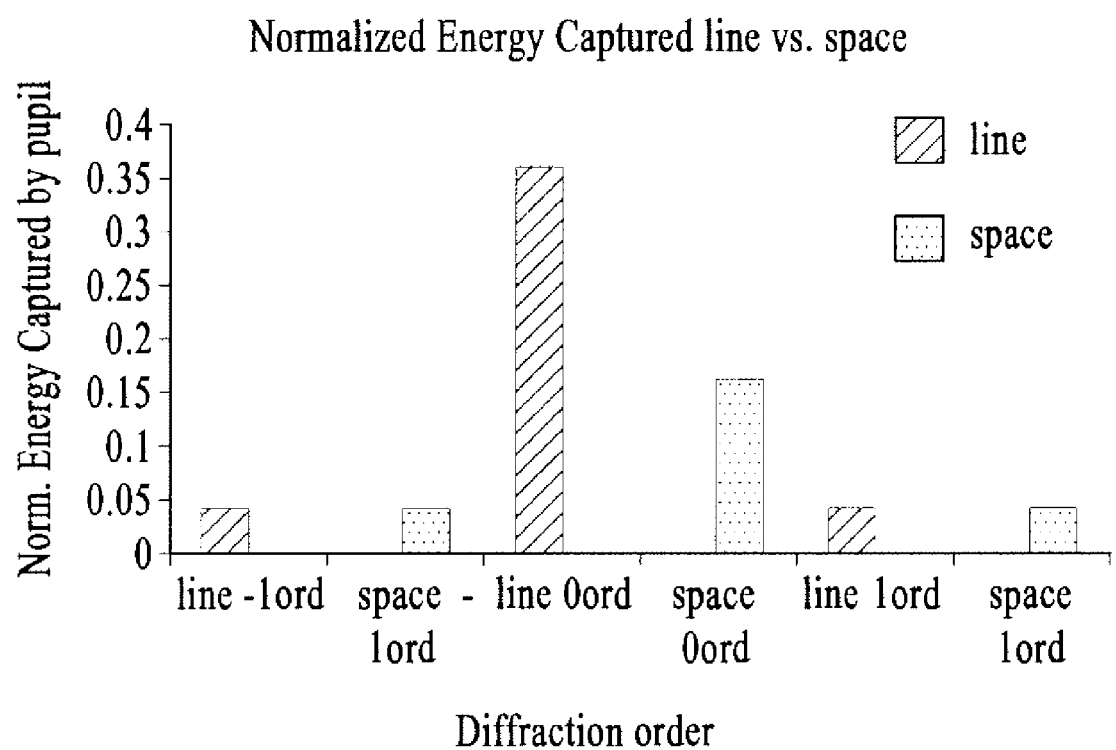
FIG. 4e is the respective NILS, minimum or maximum intensity ($I_{min}/I_{max}$), and the intensity threshold value to print to 70 nm line (clear field) and space (dark field) associated with FIGS. 4a and 4b, respectively.
FIG. 5 is an example illustrating the normalized energy captured by the lens pupil for a line and space for a feature (i.e., line or trench) having a CD of 70 nm at 175 nm pitch.

FIG. 4c and FIG. 4d illustrate the corresponding aerial images for clear field mask and dark field mask, respectively. In the given example, the illumination settings assume the use of an ASML scanner with 0.93NA and dipole x, 35 degree pole angle, the σ_out=0.86 and σ_in=0.45. FIG. 4e is the respective NILS, minimum or maximum intensity ($I_{min}/I_{max}$), and the intensity threshold value to print to 70 nm line (clear field) and space (dark field). As can be seen, not only does $I_{max}$ change more drastically for the dark field mask, but the NILS is also 20-30% lower than the clear field complementary mask. Therefore, the dark field mask has a higher mask error factor (MEF) which causes more difficulty for printing and applying OPC.

For dark field imaging, it is important to have sufficient energy to clear up the resist for patterning trenches which are mainly contributed by $0^{th}$ diffraction order, even though the $0^{th}$ diffraction order does not contribute to intensity modulation. For partial coherent imaging, the overlaps of each of the diffraction orders within the NA need to be considered and the energy captured by the lens pupil per diffraction order needs to be computed. FIG. 5 is an example illustrating the normalized energy captured by the lens pupil for a line and space for a feature (i.e., line or trench) having a CD of 70 nm at 175 nm pitch. Comparing the normalized energy captured by the pupil, it is clear that the energy that comes from the +/−first order for line and trench are identical, but there is a 2× difference in $0^{th}$ diffraction order energy. This is one of the reasons that the trench layers typically have a positive mask bias to allow more light/energy to pass through.

When utilizing clear field DDL, it is typically necessary to use "full-sized" scattering bars (FSB) in order to achieve a robust through-pitch process window. Further, as noted above, the larger the pitch, the higher the $0^{th}$ diffraction order, so it is necessary to add shielding for the critical features in the respective low contrast orientation. Further, in clear field DDL, the sum of the total exposure can trim away the FSB without leaving the print residues. This cannot be done in dark field DDL. However, in order to improve the depth of focus for a manufacturing-worthy process, "dark-field assist features (AF)" (i.e., which are formed as slots and correspond to SBs), or sub-resolution assist slots can be added during the optical proximity correction "OPC" process. It is noted that such sub-resolution assist features are also referred to as ASBs and assist features herein.

Figure 6:
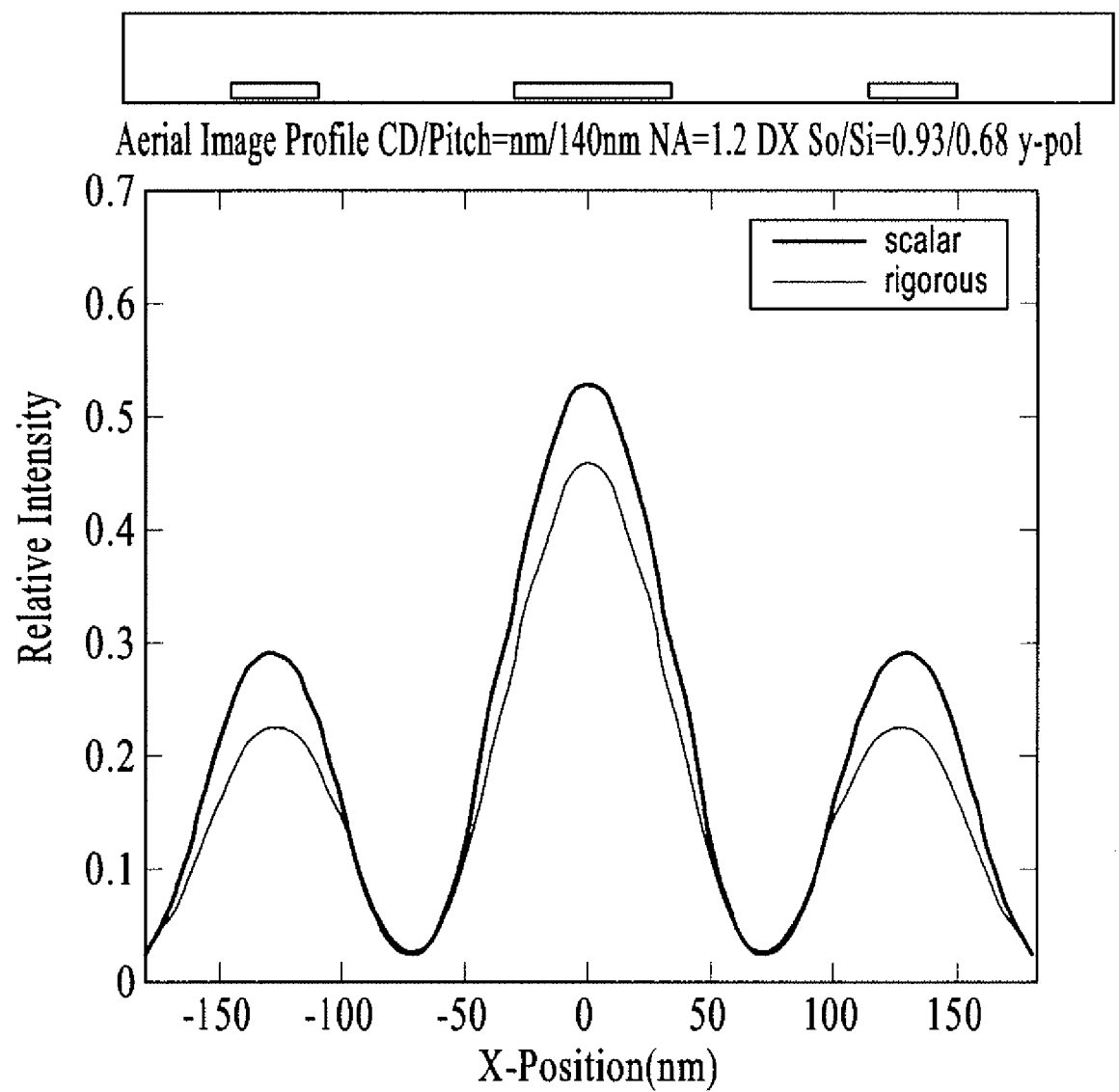
FIG. 6 illustrates a comparison of the resulting aerial image of an isolated trench with a single sided dark field SB slot for rigorous EMF versus a scalar model.

It can be problematic to apply the dark field ASB slot for 45 nm node and beyond. Specifically, as the width of a dark field ASB slot on the 4× reticle becomes less than the exposure wavelength, Kirchhoff scalar diffraction theory starts to break down and it over predicts ASB slot intensity level. Referring to FIG. 6, which compares the resulting aerial image of an isolated trench with a single sided dark field ASB slot for rigorous EMF (i.e., the model considers the full electromagnetic field when determining the aerial image) versus scalar model (i.e., a more ideal model, which does not include effects of the full electromagnetic field), the EMF aerial image indicates that the dark-field ASB slot is actually "smaller" than the scalar theory has predicted. This implies that the ASB slots have less optical weight than the scalar theory predicted. Therefore, a larger sub-resolution dark-field ASB slot is less likely to print. The risk of printing a dark field ASB slot increases when the spacing between the main features is smaller. This limits when to start applying the ASB slot effectively. Fortunately, both rigorous EMF models and scalar models predict the same position to apply dark-field ASB slot. Therefore, it is possible to optimize the placement of the dark-field ASB slot utilizing the less rigorous and time consuming scalar model. To achieve more accurate model OPC results, a full rigorous or quasi-rigorous approach such as a boundary layer method is required.

FIGS. 7b-7e illustrate simulated aerial images of a double dipole dark field imaging process in accordance with the present invention. FIG. 7a provides a simulated aerial image utilizing an annular illumination so as to provide a performance comparison with the dark field double dipole imaging process of the present invention. In the given example, a trench having a width of 55 nm and 210 nm pitch is being imaged, and the intensity threshold level is set to be 34% in order to resolve the densest pitch. The conventional prior art approach for printing such small trenches is to apply a positive bias to the trench for better printability. As noted, FIG. 7a provides the simulation result for annular illumination with 1.2 NA, σ_out=0.98, σ_in=0.53. In order to print the trench to the desired CD, the mask needs to be biased to 77 nm; yet, the NILS value is only 0.82, which is too low to be manufacturable.

For a double exposure process, relative intensity level from two exposures cannot be directly summed. However, the dose and photo-acid that is generated from the two exposures are cumulative. For chemical amplified resist, the photo-acid concentration is given by Eq. 6.

$$H(x,y) \approx 1 - e^{-cI(x,y)t} \propto I(x,y)$$
Equation 6

From Eq. 6, it can be seen that intensity is a good approximation for photo acid generation and analyzing double exposure imaging. It is noted that in the following discussion, the illumination settings include 1.2 NA x-dipole and y-dipole where σ_out=0.98, σ_in=0.53 with y and x linear polarization, respectively. In accordance with DDL imaging process of the present invention, in order to print the same trench printed in FIG. 7a, first, the x-dipole (i.e., labeled pass 1 in FIG. 7b) is used to image the trench in the vertical mask), followed by the y-dipole exposing the horizontal mask (i.e., labeled as mask 2 bias in FIG. 7b) to resolve the trench in the horizontal direction. FIG. 7e illustrates the resulting aerial image of the combined (i.e., double dipole) imaging process. As shown, the resulting NILS is 1.83 at a threshold of 34%, which represents approximately 120% improvement in NILS compared with the single, annular illumination process illustrated in FIG. 7a.

Figure 7B:
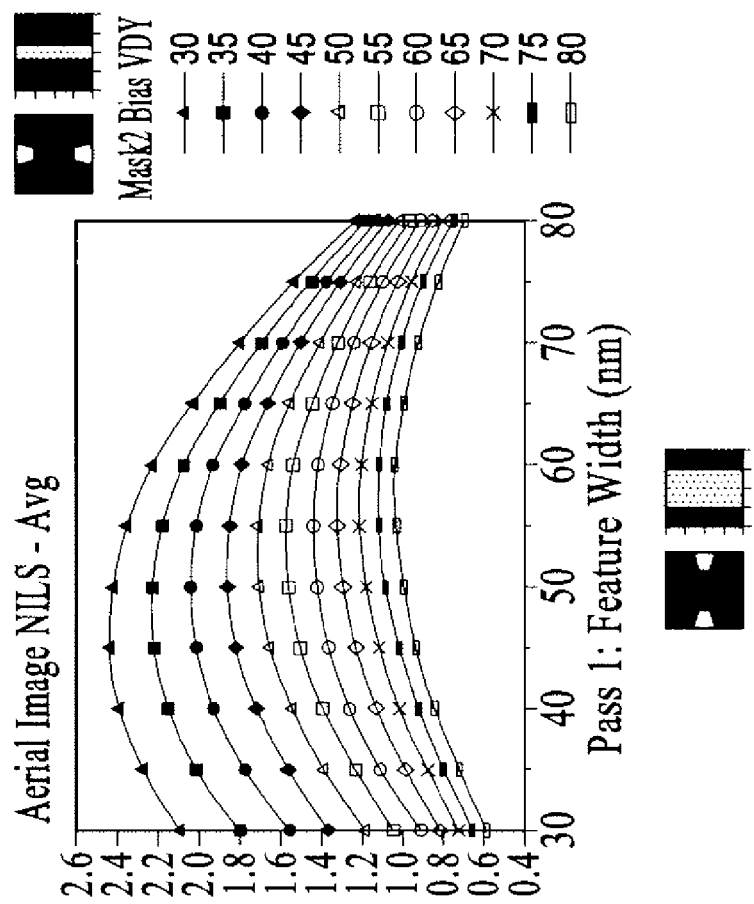
FIGS. 7b-7e illustrate simulated aerial images of a double dipole dark field imaging process in accordance with the present invention.
Figure 7A:
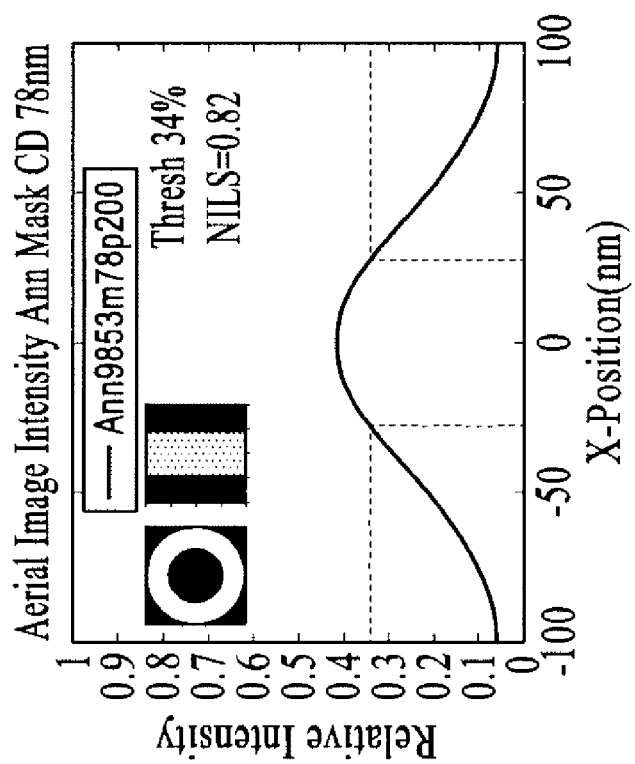
FIG. 7a illustrates a simulated aerial image of a trench utilizing an annular illumination.
Figure 7C:
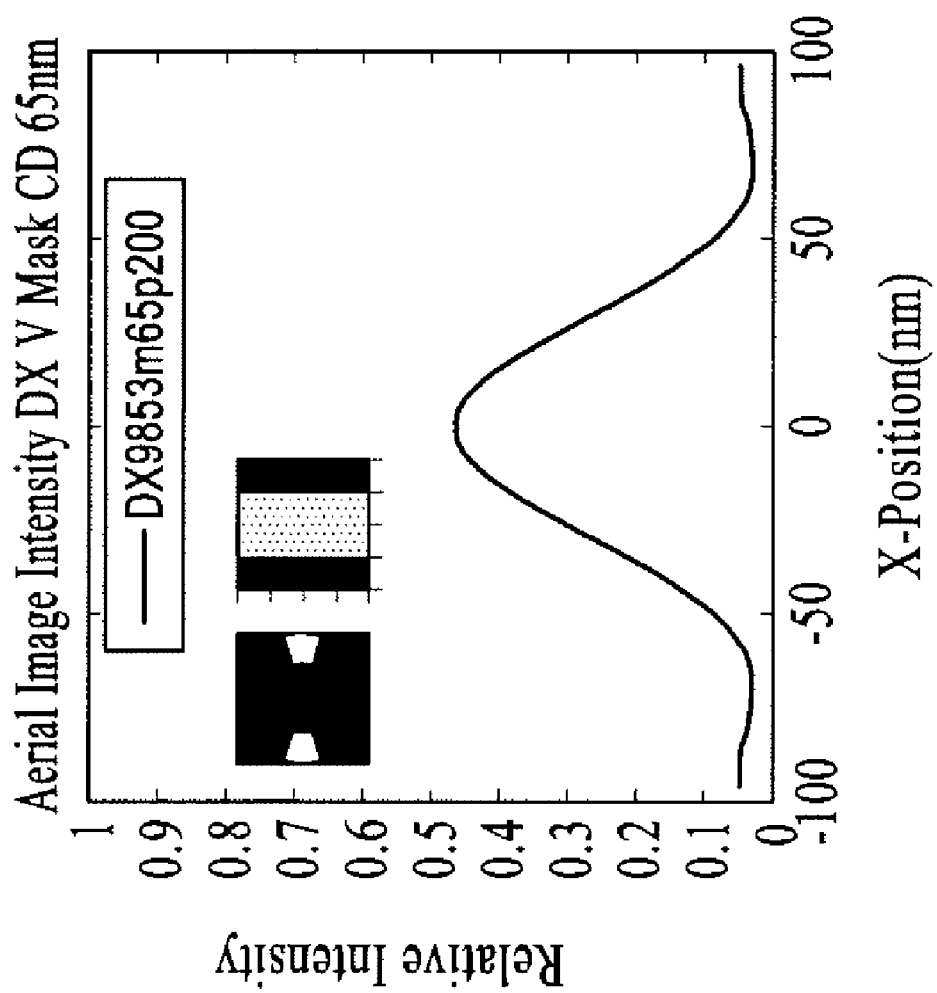
Figures 7D, 7E:
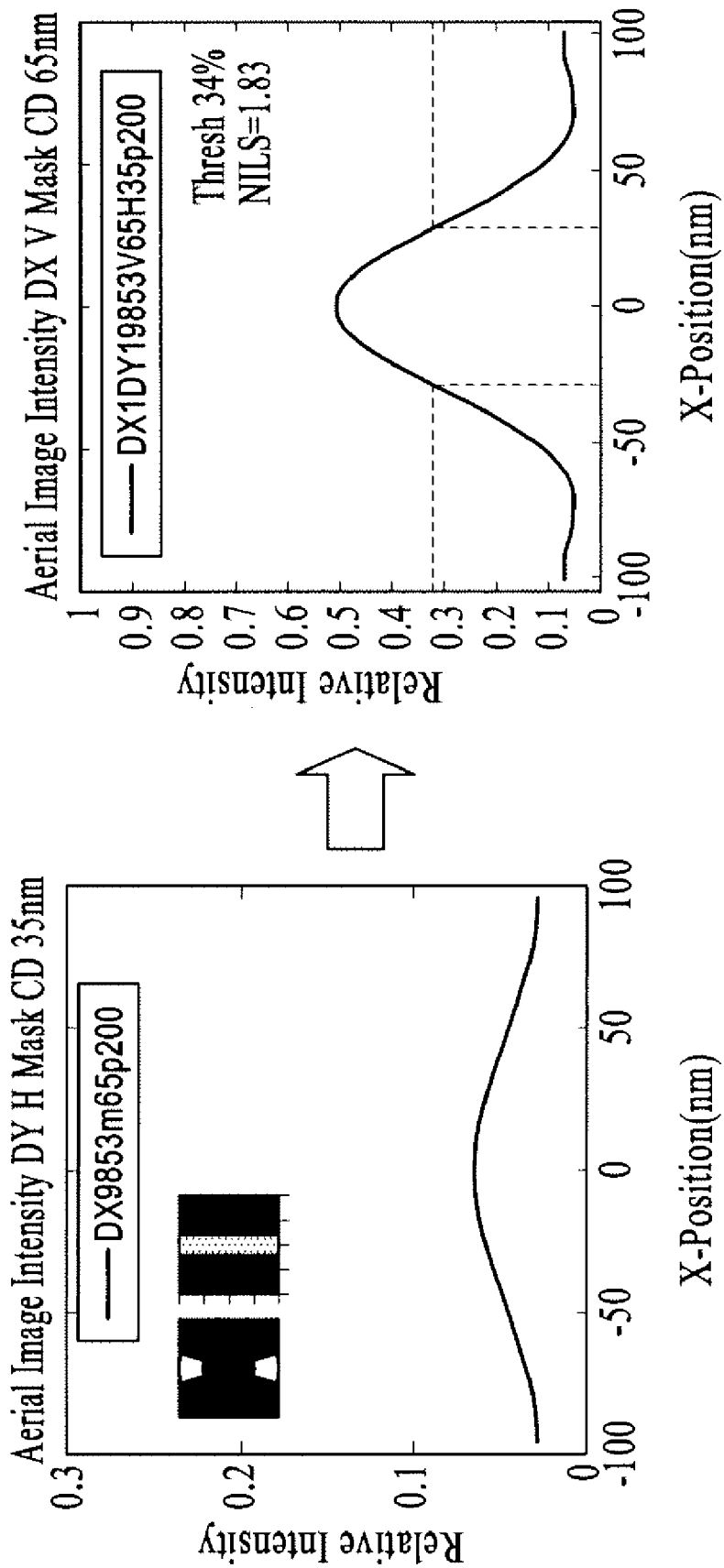

More importantly, the double exposure simulation result illustrated in FIG. 7b shows that the NILS (i.e., imaging performance) is not only a function of vertical trench size, but also as a function of the mask 2 bias. Indeed, variations in the mask 2 bias for the y-dipole exposure causes a significant change in the resulting overall NILS. As such, the combination of the bias from both masks can be used to optimize the overall NILS. This results from the fact that in the second exposure, it is possible to keep the vertical trench edge open to allow more light to pass through (see, FIG. 7d) to help optimize the NILS of the combined intensity. FIGS. 7c, 7d, and 7e illustrate an example of the optimization process. In the above example, the vertical mask is biased to 65 nm (see, FIG. 7c) and the vertical edge in the horizontal mask is negatively biased to 35 nm. As noted, the NILS of the combined intensity is 1.83, which is about a 120% improvement in NILS, compared with the single exposure baseline. Thus, in accordance with the present invention the bias associated with each mask can be adjusted in an effort to optimize the imaging performance. It is noted that in the given example, the NILS is utilized as the criteria defining imaging performance in the biasing optimization process, however, any other suitable criteria, such as, for example, DOF, MEF, ILS, contrast, etc., can be utilized as a figure of merit in the mask optimization process. Moreover, it is also possible for the optimization process to be such that the bias of both masks are optimized simultaneously or in a serial manner and/or in a manner so as to iteratively optimize both masks with different ASB slot insertions.

Figure 8:
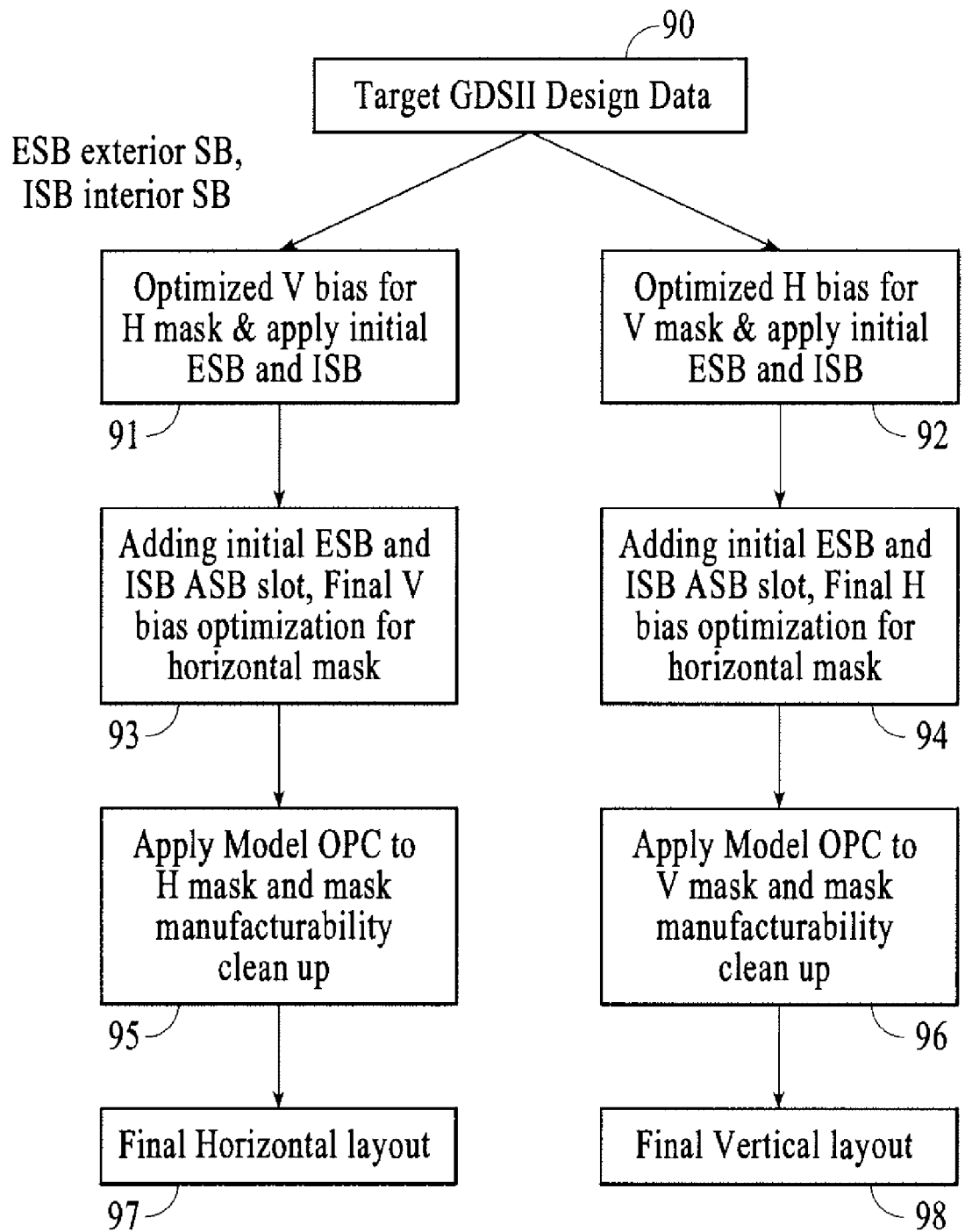
FIG. 8 illustrates an exemplary flow chart of a process for decomposing a target pattern into vertical mask and a horizontal mask for use with dark field double dipole lithography in accordance with the present invention.
Figure 9:
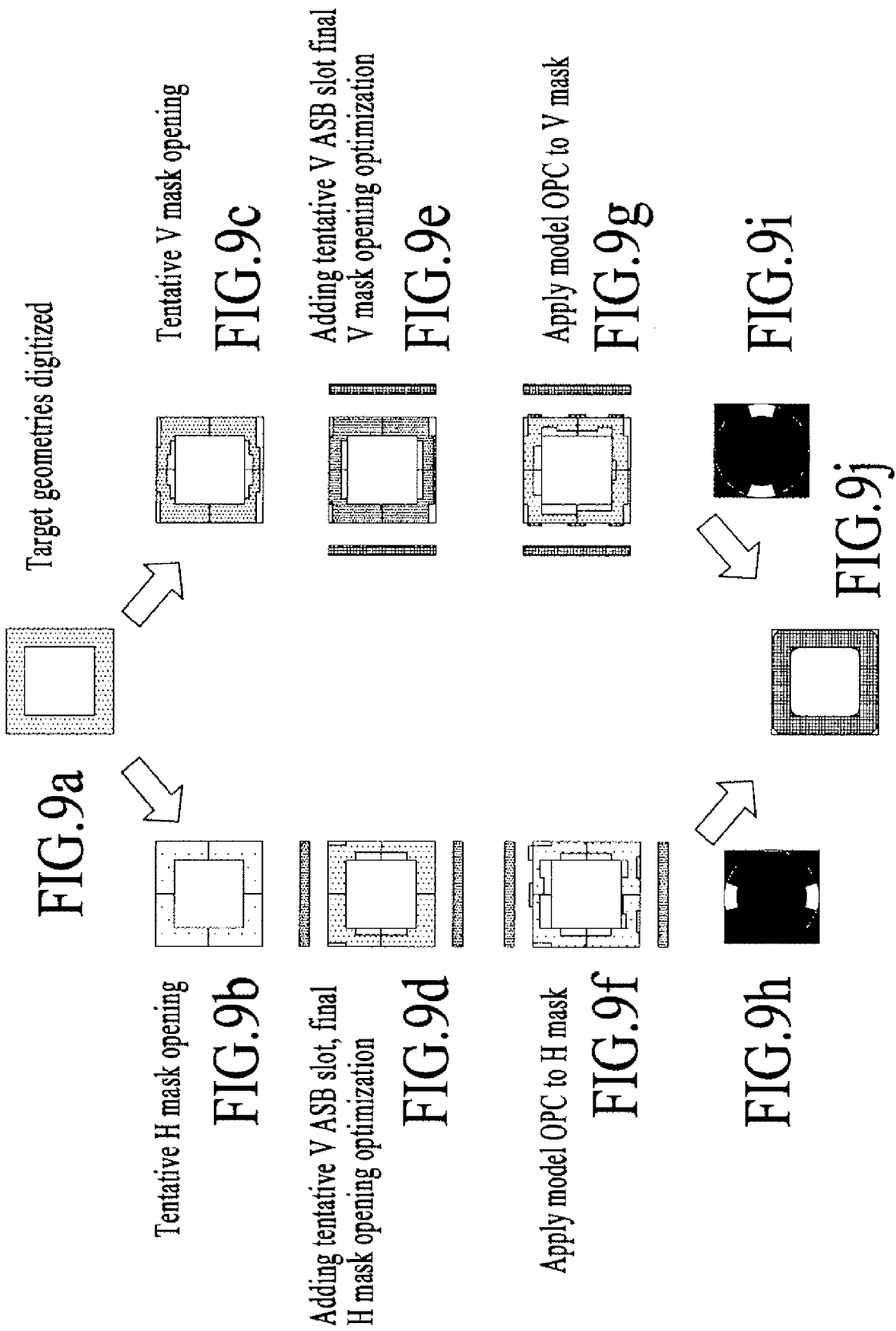
FIGS. 9a-9j illustrate an example of how the masks are generated utilizing the process of FIG. 8.

FIG. 8 illustrates an exemplary flow chart of a process for decomposing a target pattern into vertical mask and a horizontal mask for use with dark field double dipole lithography in accordance with the present invention. FIGS. 9a-9j illustrate an example of how the masks are generated utilizing the process of FIG. 8. Referring to FIG. 8, the first step in the process (Step 90) is to obtain the desired target pattern to be imaged on a wafer or substrate. The target pattern may be represented in, for example, GDSII design data format, or any other suitable data format. FIG. 9a illustrates the exemplary target pattern utilized in the example. Once the target pattern is defined, it is decomposed into vertical and horizontal masks, where Steps 91, 93, 95 and 97 shown in FIG. 8 correspond to the generation of the horizontal mask or H-mask, and Steps 92, 94, 96 and 98 correspond to the generation of the vertical mask or V-mask.

More specifically, in Steps 91 and 92, the bias for the low contrast feature of the given mask is optimized utilizing, for example, a suitable simulation model which operates to maximize a defined criteria, such as for example, but not limited to, DOF, MEF, NILS, ILS, contrast, etc. As such, in Step 91, as shown in FIG. 9b, the bias of the vertical features (i.e., low contrast features in the H-mask) are optimized in the H-mask. Similarly, in Step 92, as shown in FIG. 9c, the bias of the horizontal features (i.e., low contrast features in the V-mask) are optimized in the V-mask. Next, in Steps 93 and 94, the initial external ASBs and internal ASBs (which as noted in the case of dark field masks are slots) are applied to the respective masks, and then the biasing of the low contrast feature of the respective mask is performed again so as to obtain the final biasing. As such, in Step 93, external and internal ASBs are applied to the H-mask as required. The ASBs can be applied utilizing any suitable rule based or model based method for applying such assist features. Then, with the ASBs applied to the H-mask design, the bias of the vertical features (i.e., low contrast features in the H-mask) are again optimized. FIG. 9d illustrates the H-mask after performing Step 93 in accordance with the given example. Similarly, in Step 94, external and internal ASBs are applied to the V-mask as required, and then, with the ASBs applied to the V-mask design, the bias of the horizontal features (i.e., low contrast features in the H-mask) are again optimized. FIG. 9e illustrates the V-mask after performing Step 94 in accordance with the given example. Next, in Step 95, the H-mask is subjected to a model OPC treatment (any suitable model OPC treatment may be utilized) and mask manufacturability verification. The resulting H-mask of the given example is illustrated in FIG. 9f. After completion of Step 95, the H-mask is finalized (Step 97) and is ready to be utilized in the dark field double dipole imaging process. The H-mask is illuminated utilizing the y-dipole illumination shown in FIG. 9h. Similarly, in Step 96, the V-mask is subjected to a model OPC treatment (any suitable model OPC treatment may be utilized) and mask manufacturability verification. The resulting V-mask of the given example is illustrated in FIG. 9g. After completion of Step 96, the V-mask is finalized (Step 98) and is ready to be utilized in the dark field double dipole imaging process. The V-mask is illuminated utilizing the x-dipole illumination shown in FIG. 9i. FIG. 9j illustrates the resulting image of the double dipole process utilizing the dark field H-mask and V-mask process. It is noted that in the foregoing dark field DDL mask generation process, it is also possible that steps 91, 93, 95 and 97 for the H-mask and steps 92, 94, 96 and 98 for V-mask can be applied in a multiple pass process. Further, Steps 91 and 95 for the H-mask and steps 92 and 98 for the V-mask can be applied in a single model OPC operation with different ASB slot insertion sequence.

Figure 10:
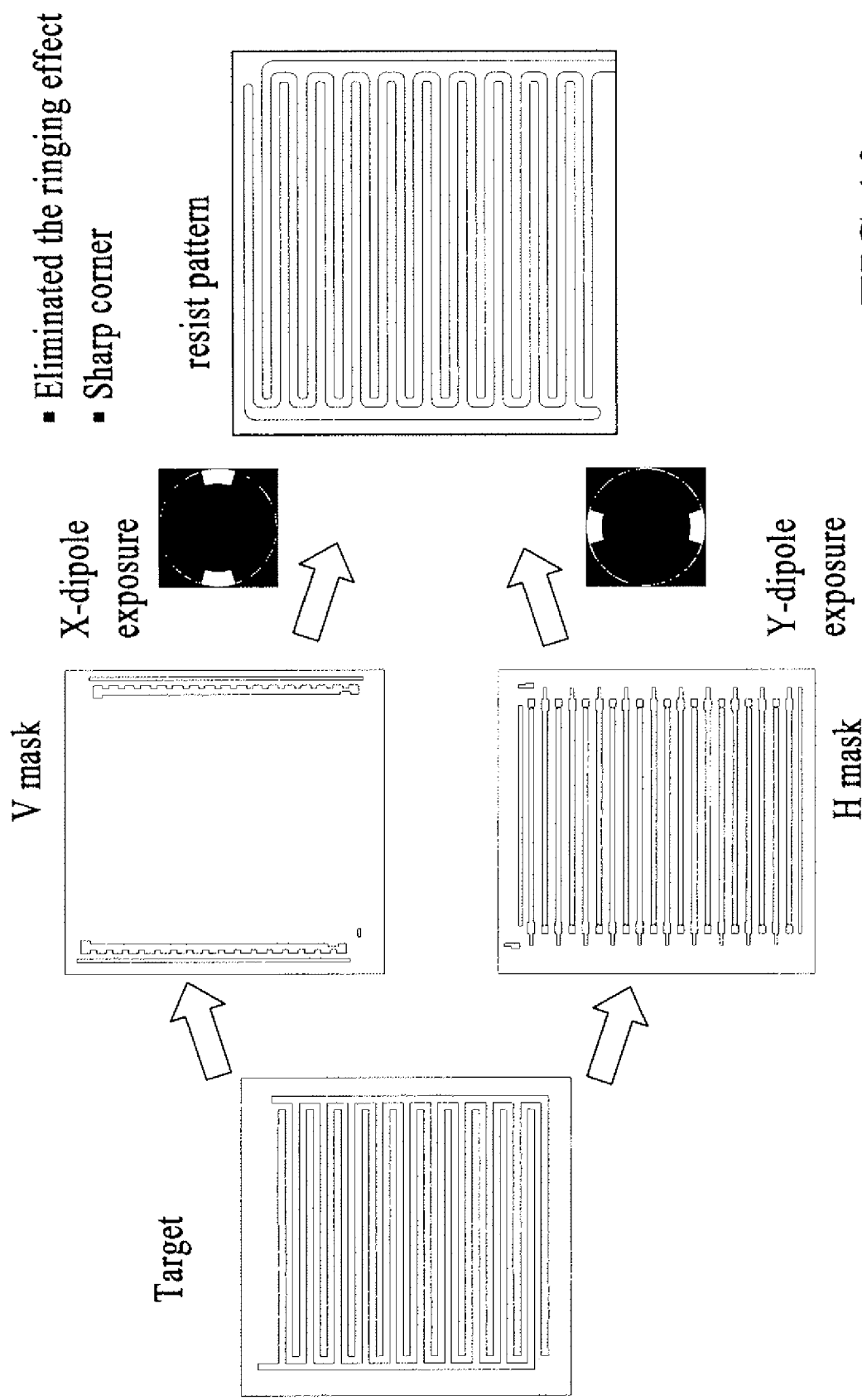
FIG. 10 illustrates an actual example of the layout conversion method of the present invention and the resulting resist pattern.

FIG. 10 illustrates an actual example of the layout conversion method of the present invention and the resulting image. Specifically, a 70 nm trench at 140 nm pitch comb target test pattern was decomposed into a H-mask and V-mask in accordance with the foregoing process, and the H-mask and V-mask were illuminated with the y-dipole and x-dipole illumination, respectively. As shown, the resulting image accurately reproduces the target pattern.

The method of the present invention provides important advantages over the prior art. Most importantly, by utilizing a dark field mask in the double dipole imaging process, it is possible to eliminate the issues associated with shielding previously imaged features when utilizing a clear field imaging process.

Figure 11:
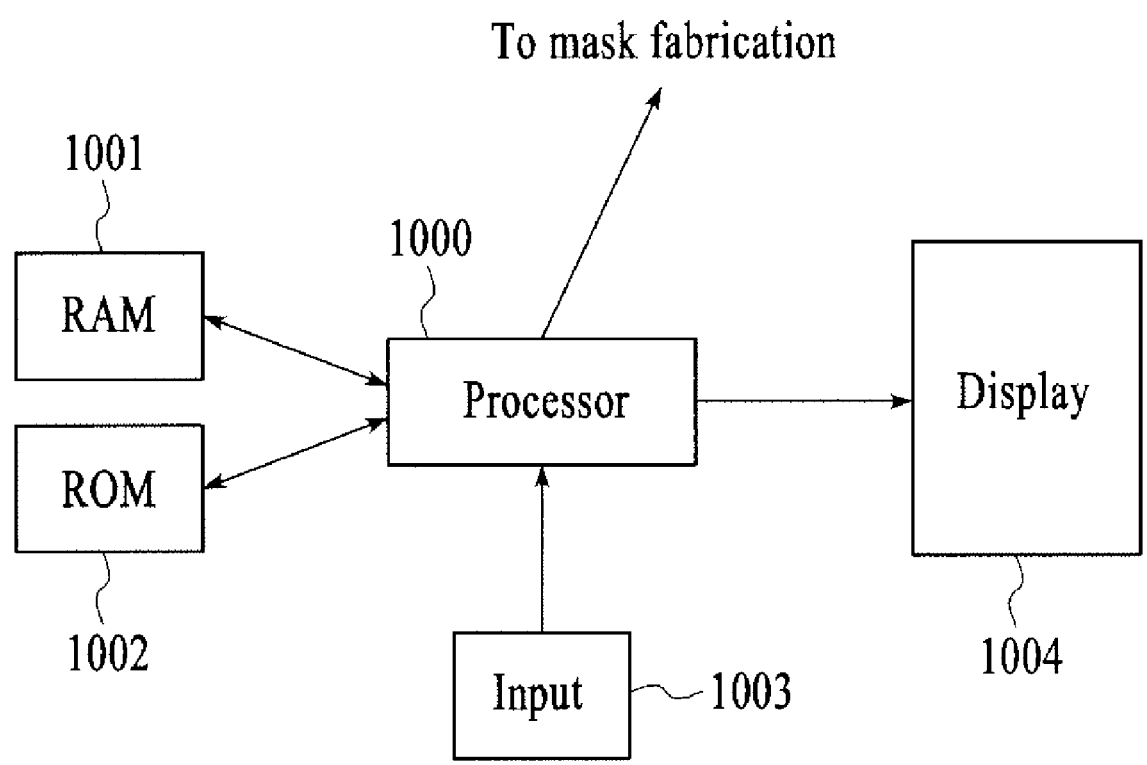
FIG. 11 illustrates an exemplary processing system for implementing the decomposition method of the present invention.

FIG. 11 illustrates an exemplary processing system for performing the decomposition process of the present invention. As illustrated in FIG. 11, an exemplary processing system may contain a processor 1000 which receives input from an input 1003. Processor 1000 may be a conventional microprocessor or may be a specially designed processing unit, such as an EEPROM or EPROM or a fabricated integrated circuit. Input 1003 may be any type of electronic input device, such as a keyboard or a mouse, or may be a memory or internet connection. Processor 1000 preferably retrieves stored protocols from ROM 1002 and RAM 1001, such as protocols to implement the methods detailed above for decomposing customized DOEs in accordance with the present invention, and stores information on RAM 1001. The calculated results (e.g., DOE design) of processor 1000 may be displayed on display 1004 and may be provided to a mask fabrication device or manufacturer.

The software functionalities of such a computer system involve programming, including executable code, may be used to implement the above described OPC method for placing assist features within a given target pattern. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Figure 12:
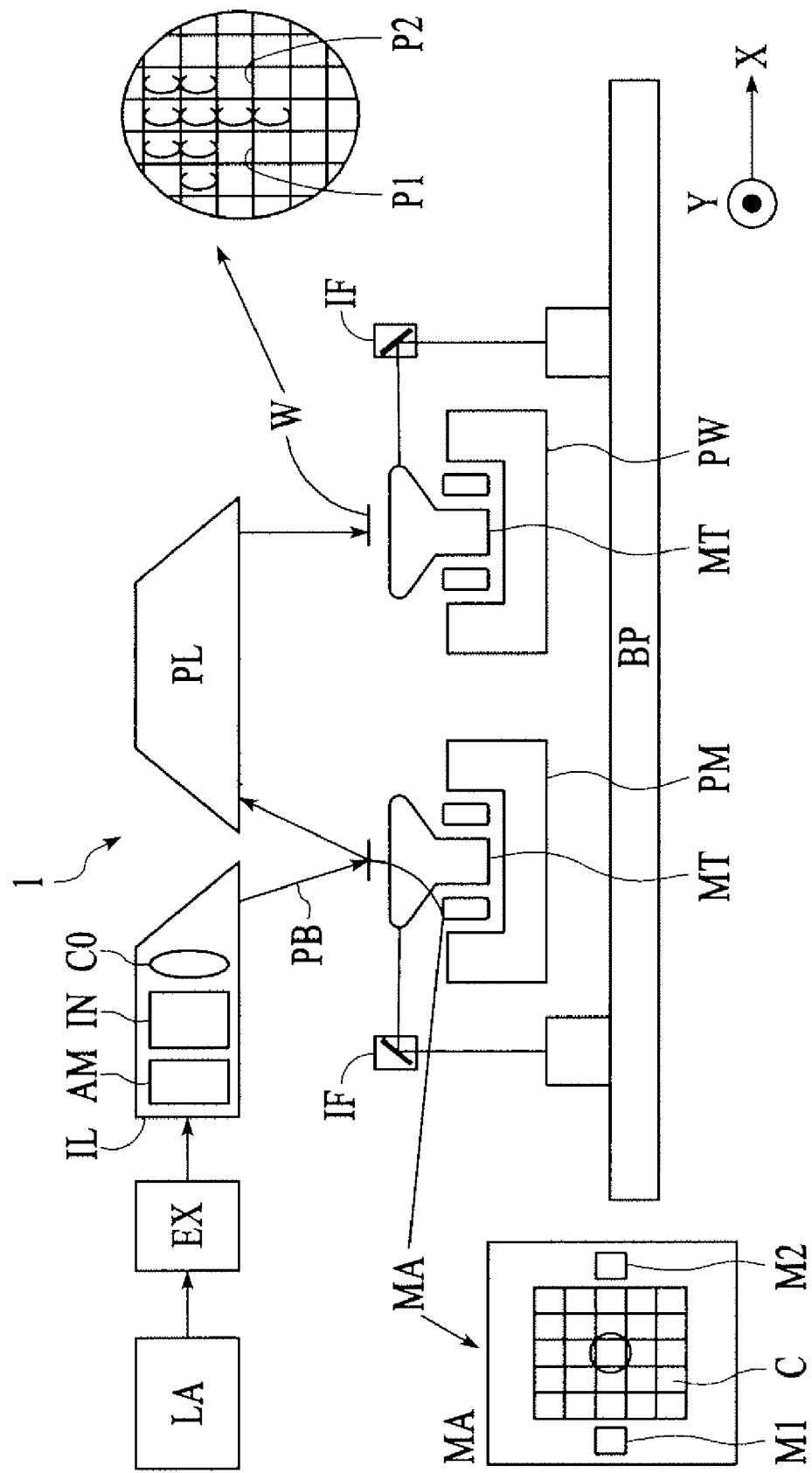
FIG. 12 schematically depicts a lithographic projection apparatus suitable for use with the masks designed with the aid of the current invention.

FIG. 12 schematically depicts a lithographic projection apparatus suitable for use with the DOEs designed with the aid of the current invention. The apparatus comprises:
 a radiation system Ex, IL, for supplying a projection beam PB of radiation. In this particular case, the radiation system also comprises a radiation source LA;
 a first object table (mask table) MT provided with a mask holder for holding a mask MA (e.g. a reticle), and connected to first positioning means for accurately positioning the mask with respect to item PL;
 a second object table (substrate table) WT provided with a substrate holder for holding a substrate W (e.g. a resist-coated silicon wafer), and connected to second positioning means for accurately positioning the substrate with respect to item PL;
 a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 12 that the source LA and DOE may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 12. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In addition, the concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

It is also noted that while the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of generating complementary masks for use in a dark field double dipole imaging process, said method comprising the steps of:

identifying a target pattern having a plurality of features, said plurality of features comprising horizontal and vertical features, generating a horizontal dark field mask based on said target pattern, said horizontal dark field mask including low contrast features, said generation of said horizontal dark field mask comprising the steps of:

optimizing the bias of said low contrast features contained in said horizontal dark field mask; and applying assist features to said horizontal dark field mask; and generating a vertical dark field mask based on said target pattern, said vertical dark field mask containing low contrast features, said generation of said vertical dark field mask comprising the steps of:

optimizing the bias of low contrast features contained in said vertical dark field mask;

applying assist features to said vertical dark field mask.

2. The method of generating complementary masks for use in a dark field double dipole imaging process according to claim 1, wherein said step of optimizing the bias of said low contrast features includes the step of adjusting the width of the vertical features contained in said horizontal dark field mask so as to maximize one or more imaging performance criteria.

3. The method of generating complementary masks for use in a dark field double dipole imaging process according to claim 1, wherein the step of generating a horizontal dark field mask further includes the step of re-performing the step of optimizing the bias of said low contrast features after the step of applying said assist features to said horizontal dark field mask.

4. The method of generating complementary masks for use in a dark field double dipole imaging process according to claim 1, wherein the step of generating a horizontal dark field mask further includes the step of performing model OPC on said horizontal dark field mask.

5. The method of generating complementary masks for use in a dark field double dipole imaging process according to claim 1, wherein said step of optimizing the bias of said low contrast features includes the step of adjusting the width of the horizontal features contained in said vertical dark field mask so as to maximize one or more imaging performance criteria.

6. The method of generating complementary masks for use in a dark field double dipole imaging process according to claim 1, wherein the step of generating said vertical dark field mask further includes the step of re-performing the step of optimizing the bias of said low contrast features after the step of applying said assist features to said vertical dark field mask.

7. The method of generating complementary masks for use in a dark field double dipole imaging process according to claim 1, wherein the step of generating a vertical dark field mask further includes the step of performing model OPC on said vertical dark field mask.

8. A device manufacturing method comprising the steps of:
(a) providing a substrate that is at least partially covered by a layer of radiation-sensitive material;
(b) providing a projection beam of radiation using a radiation system;
(c) using patterning means to endow the projection beam with a pattern in its cross-section;
(d) projecting the patterned beam of radiation onto a target portion of the layer of radiation-sensitive material,
wherein the patterning means of step (c) is generated using a method according to claim 1.

9. A non-transitory computer readable medium configured to store program instructions for execution by a processor, said program instructions enabling the processor to generate files corresponding to complementary masks for use in a dark field double dipole imaging process, said generation of said files comprising the steps of:
  identifying a target pattern having a plurality of features, said plurality of features comprising horizontal and vertical features,
  generating a horizontal dark field mask based on said target pattern, said horizontal dark field mask including low contrast features, said generation of said horizontal dark field mask comprising the steps of:
    optimizing the bias of said low contrast features contained in said horizontal dark field mask; and
    applying assist features to said horizontal dark field mask; and
  generating a vertical dark field mask based on said target pattern, said vertical dark field mask containing low contrast features, said generation of said vertical dark field mask comprising the steps of:
    optimizing the bias of low contrast features contained in said vertical dark field mask;
    applying assist features to said vertical dark field mask.

10. The non-transitory computer readable medium according to claim 9, wherein said step of optimizing the bias of said low contrast features includes the step of adjusting the width of the vertical features contained in said horizontal dark field mask so as to maximize one or more imaging performance criteria.

11. The non-transitory computer readable medium according to claim 9, wherein the step of generating a horizontal dark field mask further includes the step of re-performing the step of optimizing the bias of said low contrast features after the step of applying said assist features to said horizontal dark field mask.

12. The non-transitory computer readable medium according to claim 9, wherein the step of generating a horizontal dark field mask further includes the step of performing model OPC on said horizontal dark field mask.

13. The non-transitory computer readable medium according to claim 9, wherein said step of optimizing the bias of said low contrast features includes the step of adjusting the width of the horizontal features contained in said vertical dark field mask so as to maximize one or more imaging performance criteria.

14. The non-transitory computer readable medium according to claim 9, wherein the step of generating said vertical dark field mask further includes the step of re-performing the step of optimizing the bias of said low contrast features after the step of applying said assist features to said vertical dark field mask.

15. The non-transitory computer readable medium according to claim 9, wherein the step of generating a vertical dark field mask further includes the step of performing model OPC on said vertical dark field mask.

* * * * *